(12) United States Patent
Arishima et al.

(10) Patent No.: US 8,106,343 B2
(45) Date of Patent: Jan. 31, 2012

(54) IMAGE SENSING SYSTEM INTERPOSING LIGHT SHIELDING PORTION BETWEEN COLOR FILTER AND PIXEL ARRAYS

(75) Inventors: Yuu Arishima, Yokohama (JP); Hideaki Takada, Yokohama (JP); Seiichirou Sakai, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 360 days.

(21) Appl. No.: 12/372,099

(22) Filed: Feb. 17, 2009

(65) Prior Publication Data

US 2009/0218479 A1    Sep. 3, 2009

(30) Foreign Application Priority Data

Feb. 29, 2008 (JP) .................. 2008-051120

(51) Int. Cl.
*H01L 27/00* (2006.01)
*H01J 5/16* (2006.01)
(52) U.S. Cl. .................. 250/208.1; 250/226
(58) Field of Classification Search .......... 250/208.1, 250/226, 216, 229, 237 R, 239; 257/257, 257/258, 290, 291, 294, 428, 431–436, 440, 257/443; 348/272–283, 294, 302, 308, 306; 359/619, 627, 487, 491
See application file for complete search history.

(56) References Cited

U.S. PATENT DOCUMENTS

| | | | |
|---|---|---|---|
| 4,663,669 A | 5/1987 | Kinoshita et al. | 358/213.19 |
| 4,774,585 A | 9/1988 | Suga et al. | 358/213.19 |
| 4,780,764 A | 10/1988 | Kinoshita et al. | 358/213.19 |
| 4,821,105 A | 4/1989 | Suga et al. | 358/213.19 |
| 4,985,760 A * | 1/1991 | Maeshima et al. | 358/514 |
| 5,075,539 A * | 12/1991 | Shiraishi | 250/208.1 |
| 6,646,246 B1 * | 11/2003 | Gindele et al. | 250/208.1 |
| 6,674,470 B1 * | 1/2004 | Tanaka et al. | 348/302 |
| 6,956,605 B1 * | 10/2005 | Hashimoto | 348/301 |
| 7,187,052 B2 | 3/2007 | Okita et al. | 257/444 |
| 7,227,208 B2 | 6/2007 | Ogura et al. | 257/292 |
| 7,283,305 B2 | 10/2007 | Okita et al. | 359/619 |
| 7,335,869 B2 * | 2/2008 | Kochi | 250/208.1 |
| 7,456,880 B2 | 11/2008 | Okita et al. | 348/243 |
| 7,514,732 B2 | 4/2009 | Okita et al. | 257/292 |
| 7,531,885 B2 | 5/2009 | Okita et al. | 257/444 |
| 7,538,804 B2 | 5/2009 | Okita et al. | 348/241 |
| 7,557,847 B2 | 7/2009 | Okita et al. | 348/308 |
| 2005/0174552 A1 | 8/2005 | Takada et al. | 355/53 |
| 2005/0218297 A1 * | 10/2005 | Suda et al. | 250/208.1 |
| 2005/0269604 A1 | 12/2005 | Koizumi et al. | 257/291 |

(Continued)

FOREIGN PATENT DOCUMENTS

JP    2007-005629 A    1/2007

*Primary Examiner* — Que T Le
*Assistant Examiner* — Jennifer Bennett
(74) *Attorney, Agent, or Firm* — Fitzpatrick, Cella, Harper & Scinto

(57) ABSTRACT

An image sensing apparatus includes a pixel array, a first color filter, a second color filter, and a light shielding portion. The amount of electric charges generated in a first pixel after light of a first wavelength enters the first pixel is larger than that of electric charges generated in a second pixel after light of a second wavelength enters the second pixel. The light shielding portion defines the aperture regions of the first and second pixels so as to set the aperture area of the first pixel larger than that of the second pixel.

10 Claims, 10 Drawing Sheets

U.S. PATENT DOCUMENTS

| | | | |
|---|---|---|---|
| 2006/0043440 A1 | 3/2006 | Hiyama et al. | 257/291 |
| 2006/0044439 A1 | 3/2006 | Hiyama et al. | 348/308 |
| 2006/0291056 A1 | 12/2006 | Murata et al. | 359/486 |
| 2007/0023799 A1* | 2/2007 | Boettiger | 257/292 |
| 2008/0055445 A1 | 3/2008 | Hatano et al. | 348/302 |
| 2008/0062294 A1 | 3/2008 | Koizumi et al. | 348/300 |
| 2008/0174688 A1 | 7/2008 | Okita et al. | 348/340 |
| 2009/0159783 A1 | 6/2009 | Koizumi et al. | 250/208.1 |
| 2009/0159945 A1 | 6/2009 | Okita et al. | 257/292 |
| 2009/0201406 A1 | 8/2009 | Okita et al. | 348/308 |

* cited by examiner

FIG. 6
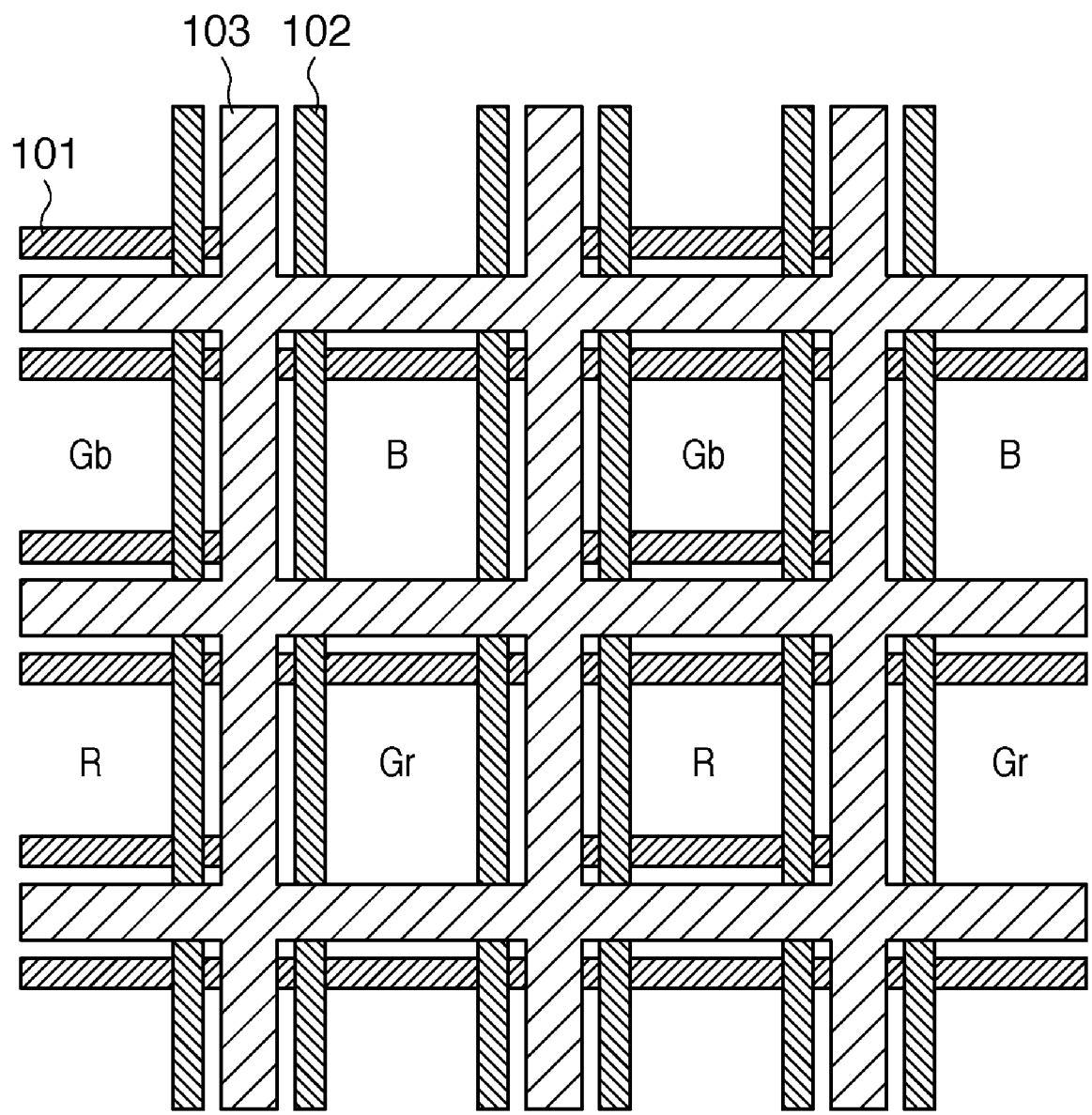
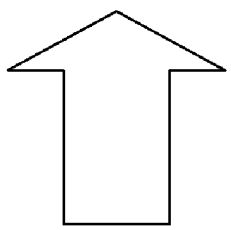

IMAGE SENSING SYSTEM INTERPOSING LIGHT SHIELDING PORTION BETWEEN COLOR FILTER AND PIXEL ARRAYS

BACKGROUND OF THE INVENTION

1. Field of the Invention

The present invention relates to an image sensing apparatus and imaging system.

2. Description of the Related Art

Image sensing apparatuses each having a pixel array in which a plurality of pixels including photoelectric conversion elements are arrayed in the row and column directions include an X-Y address type CMOS image sensor having an amplifier for each pixel, in addition to a CCD image sensor. The image sensing apparatus of this type is used in an imaging system such as a digital camera or digital video camera. Each pixel in the pixel array is generally covered with a color filter which selectively transmits light of the R (Red), G (Green), or B (Blue) wavelength to guide transmitted light of the wavelength to a pixel below the color filter.

Recently, as the number of pixels of an image sensing apparatus has increased, the pixels of the pixel array have been shrinked. Along with the shrinkage of pixels, the dimension of the aperture region of the pixel comes close to the half-wavelength of light entering the pixel. As a result, it becomes difficult for the pixel to receive light of the R wavelength which is longest among the R, G, and B wavelengths.

To solve this problem, Japanese Patent Laid-Open No. 2007-005629 discloses an image sensing apparatus in which the aperture size of an R pixel is set larger than those of the apertures of pixels of the remaining colors (G and B). According to Japanese Patent Laid-Open No. 2007-005629, this structure can reduce degradation of the image quality caused by shrinkage of pixels.

A case where white balance is adjusted in an imaging system having the image sensing apparatus disclosed in Japanese Patent Laid-Open No. 2007-005629 and a signal processing unit which processes a signal output from the image sensing apparatus to generate image data will be examined. In this case, upon receiving R, G, and B pixel signals output from the image sensing apparatus, the signal processing unit amplifies them with different gains so as to obtain a proper white level in a display or recording image. The gains of the respective colors are often determined to satisfy R gain>G gain>B gain in accordance with the characteristics (spectral characteristic and absorption characteristic) of the color filter, and the wavelength dependence of utilization efficiency of electric charges when, for example, a photoelectric conversion element is arranged on a silicon semiconductor substrate.

Assume that light (stray light) enters at least some pixels of the pixel array at a large incident angle. At this time, the mixture of colors (leakage of signal charges to an adjacent pixel) owing to stray light occurs to the same degree per unit aperture area in two adjacent pixels of different colors (e.g., R and G pixels, or B and G pixels). After output from the image sensing apparatus, pixel signals of different colors containing the mixed color component are amplified with different gains by the signal processing unit. The influence of stray light, i.e., the intensity of the mixed color component generated by stray light differs between colors in an obtained display or recording image.

Particularly in the image sensing apparatus disclosed in Japanese Patent Laid-Open No. 2007-005629, the aperture size of an R pixel is larger than those of pixels of the remaining colors (G and B). Thus, the mixture of colors by stray light in the R pixel becomes more serious than that by stray light in the G and B pixels. When R gain>G gain>B gain, the intensity of a mixed color component in the R pixel signal becomes higher than those of mixed color components in the G and B pixel signals in an image signal amplified by the signal processing unit.

As a result, the influence of stray light on a specific color (R) may stand out in an obtained image.

SUMMARY OF THE INVENTION

It is an aim of the present invention to make the influence of stray light on an obtained image uniform between colors.

According to the first aspect of the present invention, there is provided an image sensing apparatus comprising: a pixel array in which a plurality of pixels including a first pixel and a second pixel are arrayed two-dimensionally; a first color filter which selectively transmits light of a first wavelength so as to make light of the first wavelength enter the first pixel; a second color filter which selectively transmits light of a second wavelength so as to make light of the second wavelength enter the second pixel; and a light shielding portion which is interposed between the first color filter, the second color filter, and the pixel array, and defines an aperture region of each of the plurality of pixels, wherein an amount of electric charges generated in the first pixel in accordance with light of the first wavelength entering the first pixel when white light having a continuous spectrum equivalent in light energy per unit wavelength width between all wavelengths in a visible region is partially transmitted by the first color filter is larger than an amount of electric charges generated in the second pixel in accordance with light of the second wavelength entering the second pixel when the white light is partially transmitted by the second color filter, and the light shielding portion defines aperture regions of the first pixel and the second pixel so as to set an aperture area of the first pixel larger than an aperture area of the second pixel.

According to the second aspect of the present invention, there is provided an image sensing apparatus comprising: a pixel array in which a plurality of pixels including a first pixel and a second pixel are arrayed two-dimensionally; a first color filter which selectively transmits light of a first wavelength so as to make light of the first wavelength enter the first pixel; a second color filter which selectively transmits light of a second wavelength so as to make light of the second wavelength enter the second pixel; and a light shielding portion which is interposed between the first color filter, the second color filter, and the pixel array, and defines an aperture region of each of the plurality of pixels, wherein the first wavelength is shorter than the second wavelength, and the light shielding portion defines aperture regions of the first pixel and the second pixel so as to set an aperture area of the first pixel larger than an aperture area of the second pixel.

According to the third aspect of the present invention, there is provided an imaging system comprising: an image sensing apparatus defined, according to the first and second aspects of the invention, an optical system which forms an image on an image sensing surface of the image sensing apparatus; and a signal processing unit which processes a signal output from the image sensing apparatus to generate image data, wherein the image sensing apparatus senses a reference white object before sensing an object, and the signal processing unit determines a gain for a signal output from the first pixel to have a value smaller than a value of a gain for a signal output from the second pixel so as to obtain a proper white level for the reference white object in a display or recording image.

The present invention can make the influence of stray light on an obtained image uniform between colors.

Further features of the present invention will become apparent from the following description of exemplary embodiments with reference to the attached drawings.

BRIEF DESCRIPTION OF THE DRAWINGS

FIG. 6 is a plan view showing the layout of an image sensing apparatus according to the third embodiment of the present invention;

DESCRIPTION OF THE EMBODIMENTS

Figure 1:
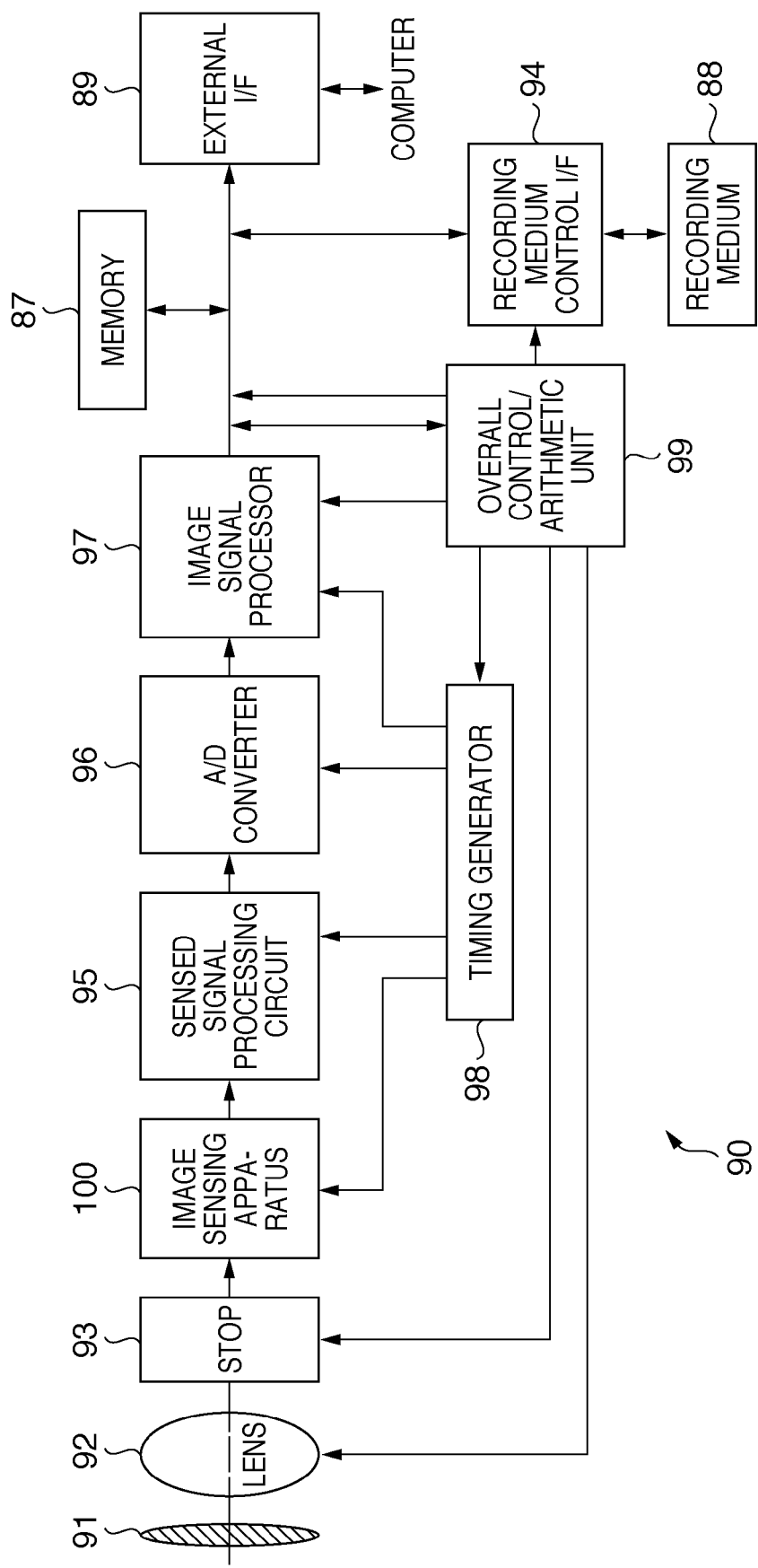
FIG. 1 is a block diagram of the configuration of an imaging system 90 to which an image sensing apparatus 100 according to an embodiment of the present invention is applied.

An imaging system 90 to which an image sensing apparatus 100 according to an embodiment of the present invention is applied will be explained with reference to FIG. 1. FIG. 1 is a block diagram of the configuration of the imaging system 90 to which the image sensing apparatus 100 according to the embodiment of the present invention is applied.

As shown in FIG. 1, the imaging system 90 mainly includes an optical system, the image sensing apparatus 100, and a signal processing unit. The optical system mainly includes a shutter 91, lens 92, and stop 93. The signal processing unit mainly includes a sensed signal processing circuit 95, A/D converter 96, image signal processor 97, memory 87, external I/F 89, timing generator 98, overall control/arithmetic unit 99, recording medium 88, and recording medium control I/F 94. The signal processing unit may not include the recording medium 88.

The shutter 91 is arranged in front of the lens 92 on the optical path to control the exposure.

The lens 92 refracts incident light to form an object image on the pixel array (image sensing surface) of the image sensing apparatus 100.

The stop 93 is interposed between the lens 92 and the image sensing apparatus 100 on the optical path. The stop 93 adjusts the quantity of light guided to the image sensing apparatus 100 after passing through the lens 92.

Before sensing an object, the image sensing apparatus 100 senses a reference white object. The image sensing apparatus 100 converts the reference white object image formed on the pixel array into the first image signal. The image sensing apparatus 100 reads out and outputs the first image signal from the pixel array. The image sensing apparatus 100 also senses an object. The image sensing apparatus 100 converts the object image formed on the pixel array into the second image signal. The image sensing apparatus 100 reads out and outputs the second image signal from the pixel array.

The sensed signal processing circuit 95 is connected to the image sensing apparatus 100, and processes the first or second image signal output from the image sensing apparatus 100.

The A/D converter 96 is connected to the sensed signal processing circuit 95. The A/D converter 96 converts the first or second image signal (analog signal) processed by and output from the sensed signal processing circuit 95 into the first or second image signal (digital signal).

The image signal processor 97 is connected to the A/D converter 96. The image signal processor 97 performs various arithmetic processes such as correction for the first or second image signal (digital signal) output from the A/D converter 96.

For example, the image signal processor 97 determines gains for R, G, and B by using the first image signal (digital signal) received from the A/D converter 96 so as to obtain a proper white level for a reference white object in a display or recording image. After that, the image signal processor 97 amplifies, with different gains, R, G, and B pixel signals in the second image signal (digital signal) received from the A/D converter 96 so as to obtain a proper white level in a display or recording image, thereby generating image data. The image signal processor 97 supplies the image data to the memory 87, external I/F 89, overall control/arithmetic unit 99, recording medium control I/F 94, and the like.

The memory 87 is connected to the image signal processor 97, and stores image data output from the image signal processor 97.

The external I/F 89 is connected to the image signal processor 97. Image data output from the image signal processor 97 is transferred to an external device (e.g., a personal computer) via the external I/F 89.

The timing generator 98 is connected to the image sensing apparatus 100, sensed signal processing circuit 95, A/D converter 96, and image signal processor 97. The timing generator 98 supplies timing signals to the image sensing apparatus 100, sensed signal processing circuit 95, A/D converter 96, and image signal processor 97. The image sensing apparatus 100, sensed signal processing circuit 95, A/D converter 96, and image signal processor 97 operate in synchronism with the timing signals.

The overall control/arithmetic unit 99 is connected to the timing generator 98, image signal processor 97, and recording medium control I/F 94, and controls all of them.

The recording medium 88 is detachably connected to the recording medium control I/F 94. Image data output from the image signal processor 97 is recorded on the recording medium 88 via the recording medium control I/F 94.

With this arrangement, the image sensing apparatus 100 can provide a high-quality image (image data) as long as it can obtain a high-quality image signal.

Figure 2:
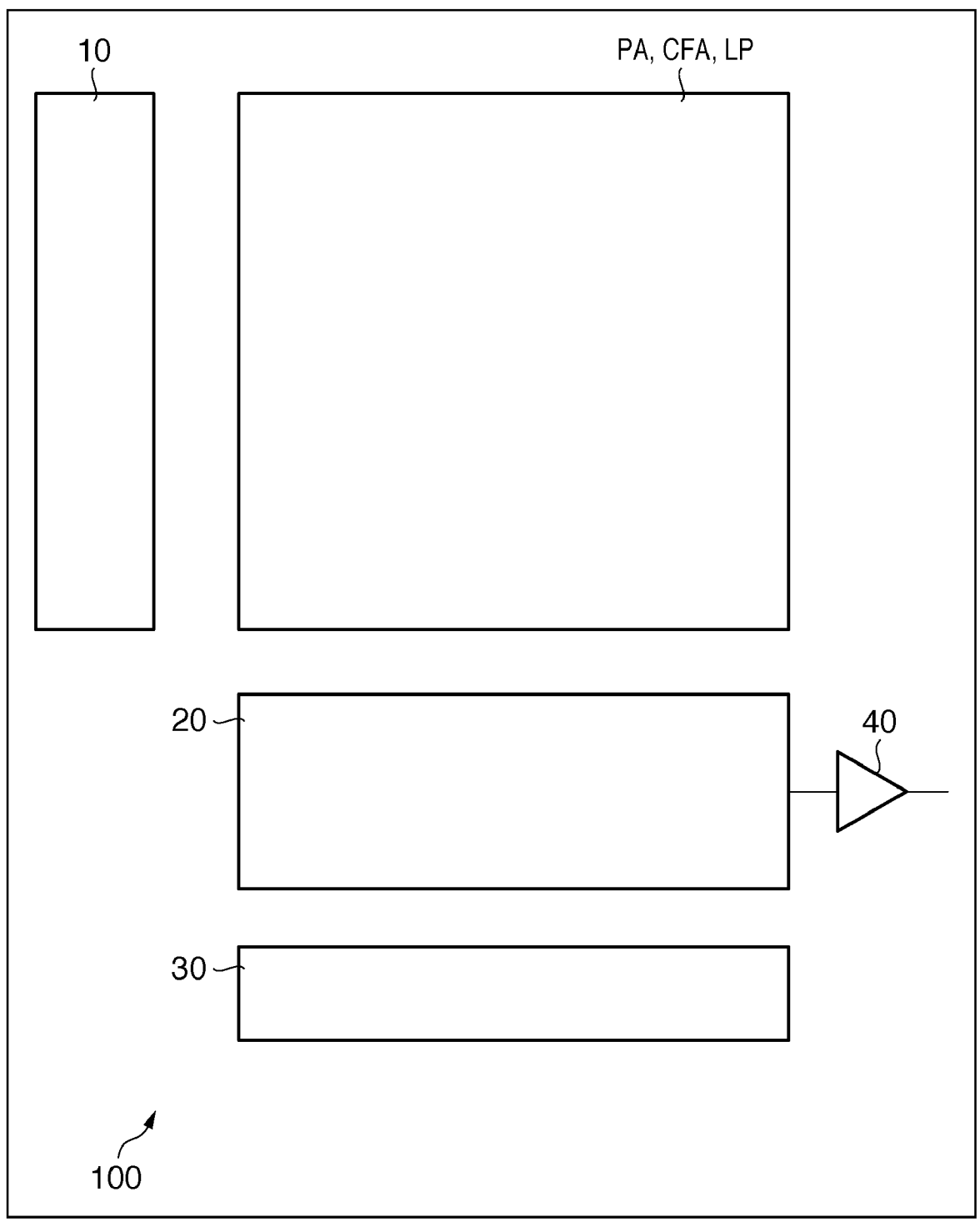
FIG. 2 is a diagram of the arrangement of the image sensing apparatus 100 according to the embodiment of the present invention.

The arrangement of the image sensing apparatus 100 according to the embodiment of the present invention will be explained with reference to FIG. 2. FIG. 2 is a diagram of the arrangement of the image sensing apparatus 100 according to the embodiment of the present invention.

The image sensing apparatus 100 includes a pixel array PA, color filter array CFA, wiring pattern (light shielding portion) LP, vertical scanning circuit 10, readout circuit 20, horizontal scanning circuit 30, and output circuit 40.

In the pixel array PA, a plurality of pixels are arrayed two-dimensionally (in the row and column directions). The pixels include the first and second pixels. For example, the first and second pixels are arranged adjacent to each other in the row or column direction. Each pixel includes a photoelectric conversion element (e.g., photodiode).

In the color filter array CFA, a plurality of color filters are arrayed two-dimensionally (in the row and column directions). Each color filter is arranged above each pixel (front side in FIG. 2) in the pixel array PA. The color filters include the first and second color filters. The first color filter selectively transmits light of the first wavelength so that light of the first wavelength enters the first pixel. The second color filter selectively transmits light of the second wavelength so that light of the second wavelength enters the second pixel.

The amount of electric charges generated in the first pixel in accordance with light of the first wavelength entering the first pixel when white light is partially transmitted by the first color filter is larger than that of electric charges generated in the second pixel in accordance with light of the second wavelength entering the second pixel when white light is partially transmitted by the second color filter. The white light has a continuous spectrum equivalent in light energy per unit wavelength width between all wavelengths in the visible region.

As the wavelength of incident light is shorter, photoelectric conversion occurs closer to the surface of a semiconductor substrate. As the wavelength of incident light is longer, photoelectric conversion occurs at a deeper position in the semiconductor substrate. Hence, a pixel corresponding to a short wavelength tends to output a larger amount of electric charges available as a signal. This phenomenon becomes conspicuous when a silicon substrate is used as a semiconductor substrate.

The wiring pattern LP is interposed between the color filter array CFA (first and second color filters) and the pixel array PA in a direction perpendicular to the sheet surface of FIG. 2. The wiring pattern LP defines the aperture region of each pixel. The wiring pattern LP defines the aperture regions of the first and second pixels so that the aperture area of the first pixel becomes larger than that of the second pixel.

The vertical scanning circuit 10 scans pixels on the respective rows of the pixel array PA in the vertical direction (column direction) to output, from the pixels on the respective rows, signals corresponding to the amounts of electric charges generated in the pixels on the respective rows. Since the amount of electric charges generated in the first pixel is larger than that of electric charges generated in the second pixel, the level of a signal output from the first pixel is higher than that of a signal output from the second pixel.

Upon receiving signals output from pixels on the respective columns of the pixel array PA, the readout circuit 20 temporarily holds the received signals.

The horizontal scanning circuit 30 scans the readout circuit 20 in the horizontal direction (row direction) to sequentially transfer, to the output circuit 40, the signals of pixels on the respective columns that are held by the readout circuit 20.

The output circuit 40 generates an image signal from the transferred signals, and outputs the generated image signal to a subsequent stage (the sensed signal processing circuit 95).

The level of a signal output from the first pixel is higher than that of a signal output from the second pixel. In accordance with this, the signal processing unit subsequent to the image sensing apparatus 100 determines a gain for a signal output from the first pixel to have a value smaller than that of a gain for a signal output from the second pixel so as to obtain a proper white level in a display or recording image.

As described above, the aperture area of the first pixel is set larger than that of the second pixel. When the mixture of colors by stray light occurs to the same degree per unit aperture area in the first and second pixels, the mixture of colors by stray light in the first pixel becomes more serious than that by stray light in the second pixel. Even in this case, a gain used in a subsequent signal processing unit (the image signal processor 97 shown in FIG. 1) for the signal of the first pixel is determined to have a value smaller than that of a gain for the signal of the second pixel in correspondence with the fact that the amount of electric charges generated in the first pixel is larger than that generated in the second pixel. Thus, the intensity of the mixed color component in the signal of the first pixel can be made equal to that of the mixed color component in the signal of the second pixel in an image signal amplified by the signal processing unit. As a result, the influence of stray light on an obtained image can be made uniform.

First Working Example

Figure 3:
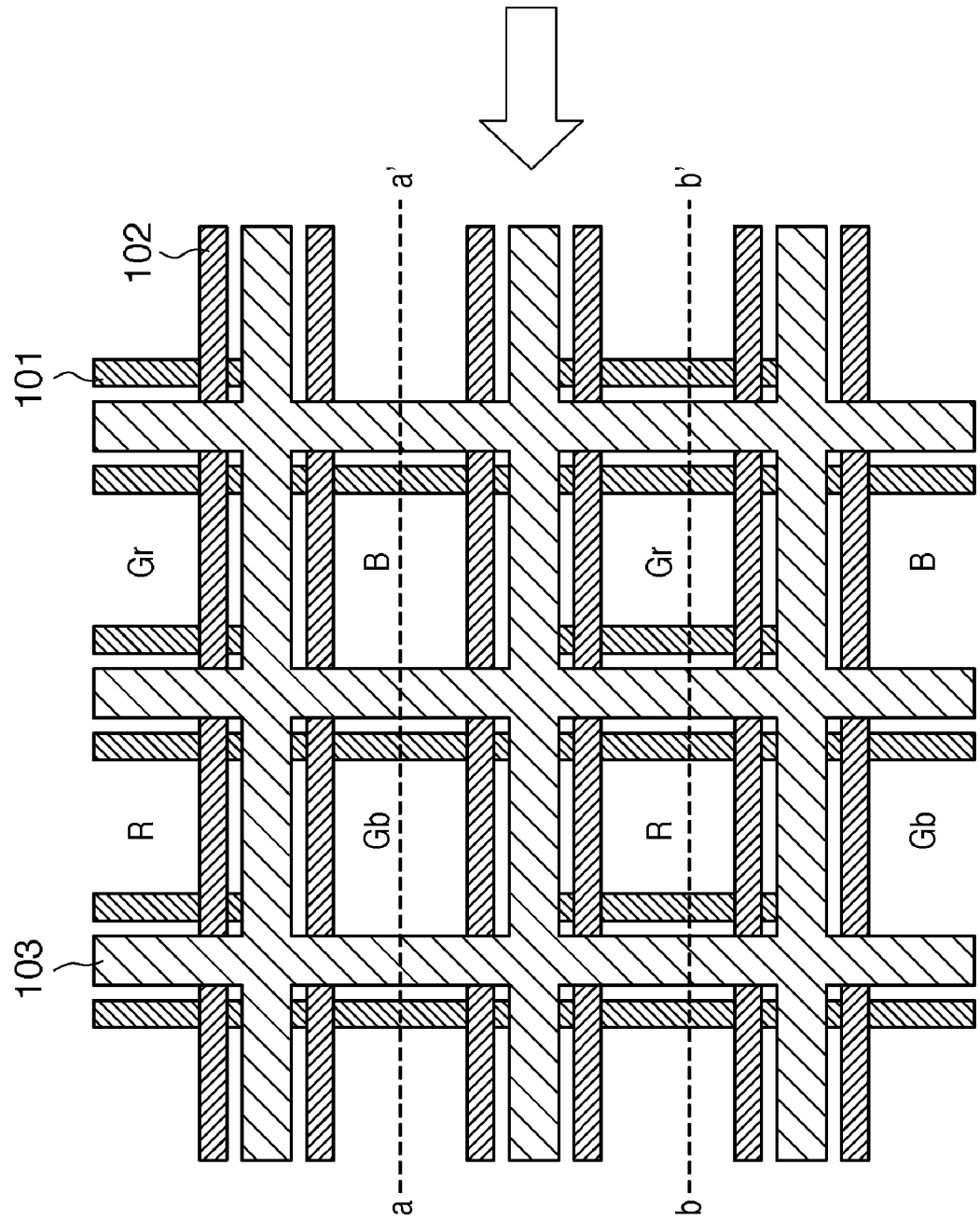
FIG. 3 is a plan view showing the layout of an image sensing apparatus according to the first embodiment of the present invention.

The first working example will be described as an example in which the first wavelength is shorter than the second one. An image sensing apparatus according to the first working example of the present invention will be explained with reference to FIG. 3. FIG. 3 is a plan view showing the layout of the image sensing apparatus according to the first working example of the present invention.

A problem arising from the first wavelength (e.g., B wavelength) and the second wavelength (e.g., R wavelength) will be explained.

In FIG. 3, a partial region of a pixel array PA is extracted and illustrated. A partial region of a wiring pattern LP is hatched. The wiring pattern LP includes a plurality of wiring layers 101 to 103. The wiring layer 101 is the lowermost wiring layer (first wiring layer) in the wiring pattern LP. The wiring layer 103 is the uppermost wiring layer (third wiring layer) in the wiring pattern LP. The wiring layer 102 is an intermediate wiring layer (second wiring layer) between the wiring layers 101 and 103.

In FIG. 3, a microlens for improving focusing conditions is not illustrated. The optical design of the microlens has a purpose of minimizing the loss of light owing to reflection by the uppermost wiring layer 103 of the wiring pattern LP. Hence, the wiring layer 103 serves as a light shielding layer.

In FIG. 3, partial regions of the color filter array CFA are represented by colors (R, Gb, Gr, and B) being transmitted by color filters. The color filter array CFA is, e.g., a Bayer array. In FIG. 3, assume that stray light enters the light receiving surface at an acute angle (large incident angle) with respect to the light receiving surface in a direction indicated by an arrow along the long side (row direction) of the pixel array. In this case, the optical mixture of colors occurs to the same degree per unit aperture area between R and Gr pixels or Gb and B pixels adjacent to each other in the row direction. Since adjacent pixels are not completely shielded from each other, the mixture of colors occurs to a certain degree. If pixels are completely shielded by a wiring layer or the like, the yield may decrease, so such a structure is not generally employed.

The number of electrons generated for each color (amount of electric charges generated in a pixel of each color) changes depending on the spectral characteristic of the color filter and a spectral characteristic corresponding to the wavelength of the photoelectric conversion element. Thus, white balance is adjusted by multiplying signals of respective colors by gains by a subsequent signal processing unit. For example, R·gr, Gr·gg, Gb·gg, and B·gb represent outputs multiplied by gains for the respective colors in order to adjust white balance. In this case, gr represents a gain to multiply R in a subsequent stage, gg represents a gain to multiply Gr and Gb in the subsequent stage, and gb represents a gain to multiply B in the subsequent stage. As for optical mixture of colors by light entering at an acute angle (large incident angle), ab represents the amount of optical mixture of Gb to B along a line a-a' in FIG. 3, and ar represents that of optical mixture of Gr to R along a line b-b'. If the layout of elements in a pixel is the same for the respective colors, ar=ab.

Assume that the amounts of signal charges in R and B pixels in accordance with light entering at a small incident angle are R:B=1:2. In this case, letting gr:gb=2:1, the signals of the R and B pixels after amplification by the signal processing unit become equal to each other:

$$R \cdot gr = B \cdot gb \quad (1)$$

The amount of electric charges generated by light entering at an acute angle (large incident angle) is (R+Gr·ar) for the R pixel and (B+Gb·ab) for the B pixel in consideration of the amount of optical mixture of colors. In this case, letting gr:gb=2:1, the signals of the R and B pixels after amplification by the signal processing unit become different from each other:

$$(R+Gr \cdot ar) \cdot gr > (B+Gb \cdot ab) \cdot gb \quad (2)$$

Assuming that outputs from G pixels are equal to satisfy Gr=Gb, the final intensity of optical mixture of colors apparently becomes different between R and B more than expected.

Since the influence of stray light in an image differs between colors, the influence of stray light on a specific color (R in this case) stands out in an obtained image (white balance is lost). The visual characteristic of a human is particularly sensitive to R, so the image looks very poor.

To solve this, the working example sets ar<ab so that the final intensity of optical mixture of colors becomes equal between R and B, or the image becomes bluish to make the optical mixture of colors less noticeable. The working example sets ar<ab by changing the wiring pattern LP between a-a' and b-b' in FIG. 3, i.e., setting the aperture area of the B pixel larger than that of the R pixel. This provides a condition to mix B having a small gain more readily than R having a large gain. Accordingly, the difference between colors in the intensity of optical mixture of colors in an amplified image signal can be minimized, reducing unexpected coloring upon development.

Similar to Japanese Patent Laid-Open No. 2007-005629, the aperture of the light shielding layer of an R pixel may also be widened to make R and B outputs equal and set gains in the subsequent stage to gr=gb. However, to increase the sensitivity of each pixel as much as possible along with miniaturization of pixels, it is appropriate to widen the aperture sizes of all pixels as much as possible.

Figure 4:
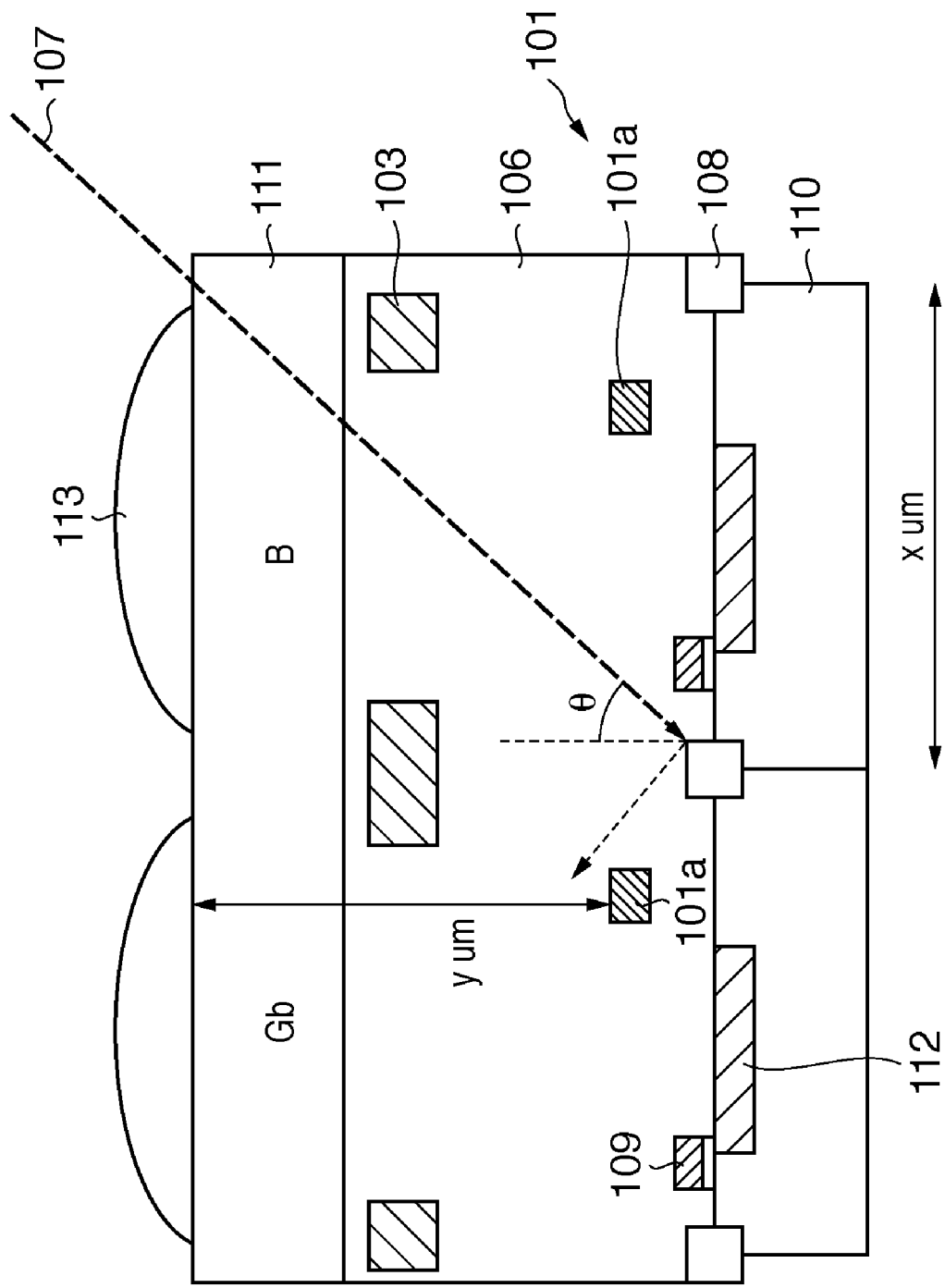
FIG. 4 is a sectional view taken along a line a-a' in FIG. 3.
Figure 5:
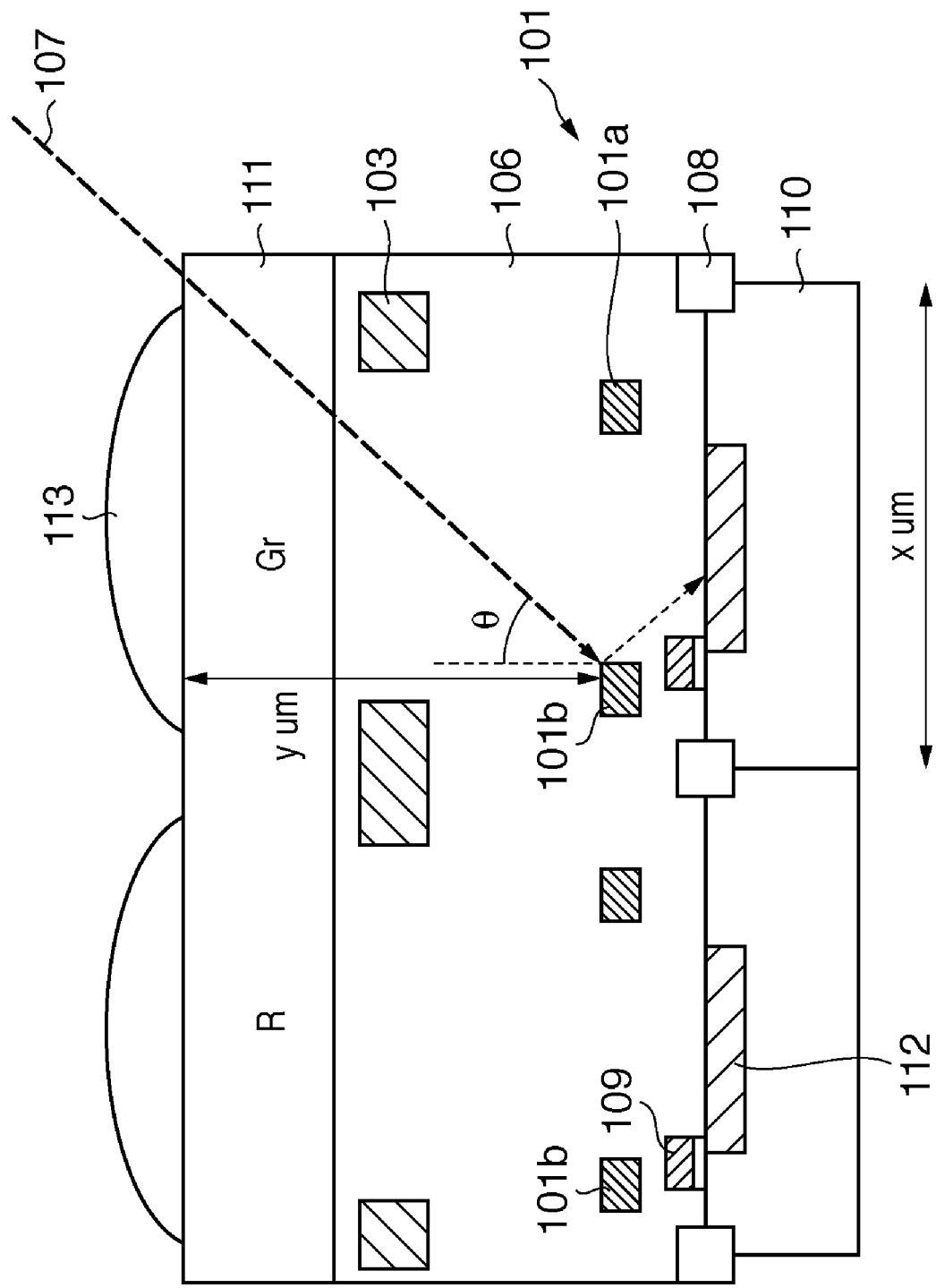
FIG. 5 is a sectional view taken along a line b-b' in FIG. 3.

A characteristic structure in the working example will be explained with reference to FIGS. 3 to 5. FIG. 4 is a sectional view taken along the line a-a' in FIG. 3. FIG. 5 is a sectional view taken along the line b-b' in FIG. 3.

The gain in the subsequent stage is set to be largest for R, and decreases in the order of G and B. As shown in FIG. 3, the number of wiring lines of a wiring layer 101 is small on the left side of Gb and B pixels, but large on the left side of R and Gr pixels. These structures are shown in the sectional views of FIGS. 4 and 5.

In FIG. 4, an N-type diffusion region 112 is formed in a P-type well region 110, and electric charges generated by incident light are transferred using a transfer electrode 109. Reference numeral 108 denotes an element isolation region; and 101, 102, and 103, wiring layers between which an interlayer insulation film 106 exists. Reference numeral 111 denotes a color filter layer for color separation; and 113, a microlens. Since no wiring line of the wiring layer 101 exists between Gb and B, the adjacent pixels are not shielded by a wiring line.

For example, in FIG. 4, assume that x μm is 5.2 μm, and that y μm is 4.9 μm. When a light beam 107 enters at an incident angle of about θ=50° or more, it leaks as stray light to an adjacent pixel.

As shown in FIG. 5 which is a sectional view of R and Gr, a wiring line 101b exists in addition to the same wiring lines as those in FIG. 4 and a wiring line 101a of the wiring layer 101. This structure makes it difficult to leak an incident light beam as stray light to an adjacent pixel. Under the condition of FIG. 5, when the wiring line 101b is extended from the end of a pixel to above a photoelectric conversion element by about 1.15 μm, the quantity of light of about θ=50° or more leaking to an adjacent pixel can be decreased.

From this relationship, the area of an aperture formed by the wiring layer above the photoelectric conversion element becomes relatively large in Gb and B pixels. When light enters at a large incident angle, the ratio at which the light is captured as stray light increases. The mixture of colors between Gr and B pixels becomes greater than that between R and Gr pixels. Although the B output is multiplied by gain and emphasized, the gain for B is smaller than that for R, suppressing the degree of degradation of the image quality. Hence, degradation of the image quality by light entering at an unexpectedly large incident angle can be reduced.

The manufacturing yield can also be increased by decreasing the wiring area as shown in FIG. 3.

It should be noted that, when the magnitude relationship between R and B gains is reversed, pixels along which wiring lines are arranged are changed to Gb and B, satisfying the same relationship of the mixture of colors as the above-described one. Similarly, the gain in the subsequent stage is set to R>G>B, but even if the order changes, the same effects can be achieved by increasing the aperture area of a pixel having a smaller gain.

Second Working Example

The second working example of the present invention will be explained.

In the second working example, a pixel having the largest aperture area above a photoelectric conversion element is a pixel corresponding to the shortest wavelength. In this case, such a pixel is a pixel using the B color filter. This is because the visual characteristic of a human eye is more sensitive to R than B. When light enters at an acute angle, a large aperture area of B promotes the mixture of colors. When the image is developed upon multiplying the output by a gain which is set in accordance with general incident light to adjust white balance, the image becomes bluish. However, degradation of the bluish image is less conspicuous than that of a reddish image. Even when light enters at a large incident angle, which is generally not expected, degradation of the image quality can be suppressed.

Third Working Example

The third working example of the present invention will be explained with reference to FIG. 6. FIG. 6 is a plan view showing the layout of an image sensing apparatus according to the third working example of the present invention.

FIG. 6 is a plan view in consideration of optical mixture of colors in the vertical direction (column direction) of a Bayer array (pixel array). The "vertical direction" corresponds to the short side direction (column direction) of a rectangular image sensing region (pixel array). At this time, the gain in a subsequent stage is set to be largest for R, and decreases in the order of G and B. Similar to the first working example, the B pixel has a large aperture area and suffers serious mixture of colors owing to stray light. However, a gain for the signal of the B pixel in the subsequent signal processing unit is small, so fluctuation (poor white balance) of the influence of stray light on an image signal are reduced. The manufacturing yield can also be increased by decreasing the wiring area as shown in FIG. 6.

Fourth Working Example

Figure 7:
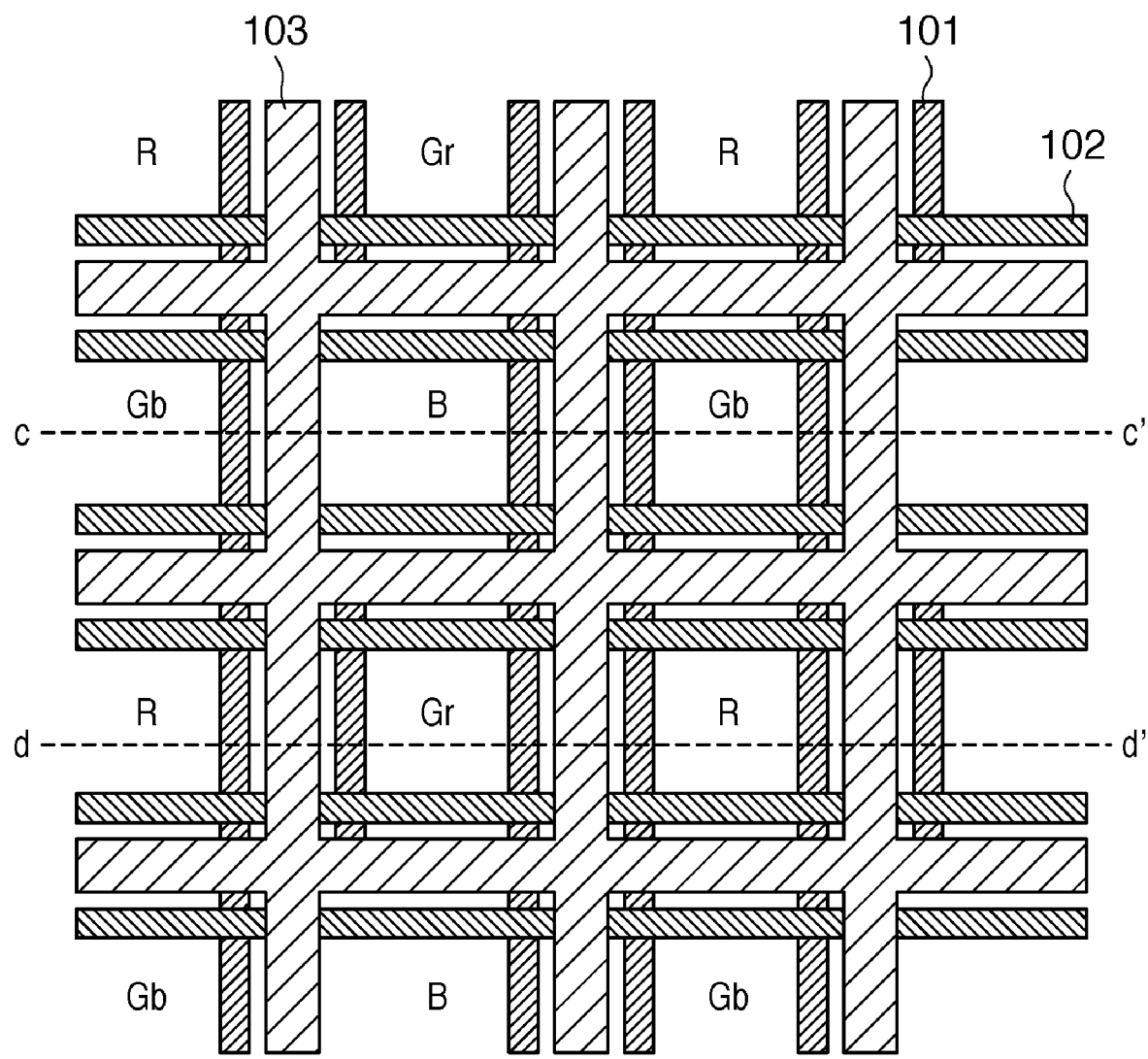
FIG. 7 is a plan view showing the layout of an image sensing apparatus according to the fourth embodiment of the present invention.

The fourth working example of the present invention will be explained with reference to FIG. 7. FIG. 7 is a plan view showing the layout of an image sensing apparatus according to the fourth working example of the present invention.

In the fourth working example, an R pixel is a pixel having a small-area aperture formed by wiring lines (a lowermost wiring layer 101 in a wiring pattern LP) closest to an N-type region 112 (see FIG. 4) of a photoelectric conversion element. In the pixel, the area of an aperture area formed by wiring lines (the lowermost wiring layer 101 in the wiring pattern LP) closest to the photoelectric conversion element (the N-type region 112) determines whether to photoelectrically convert light entering at an acute angle. Degradation of the image quality can be reduced by decreasing the aperture area of R which stands out upon development.

Fifth Working Example

Figure 8:
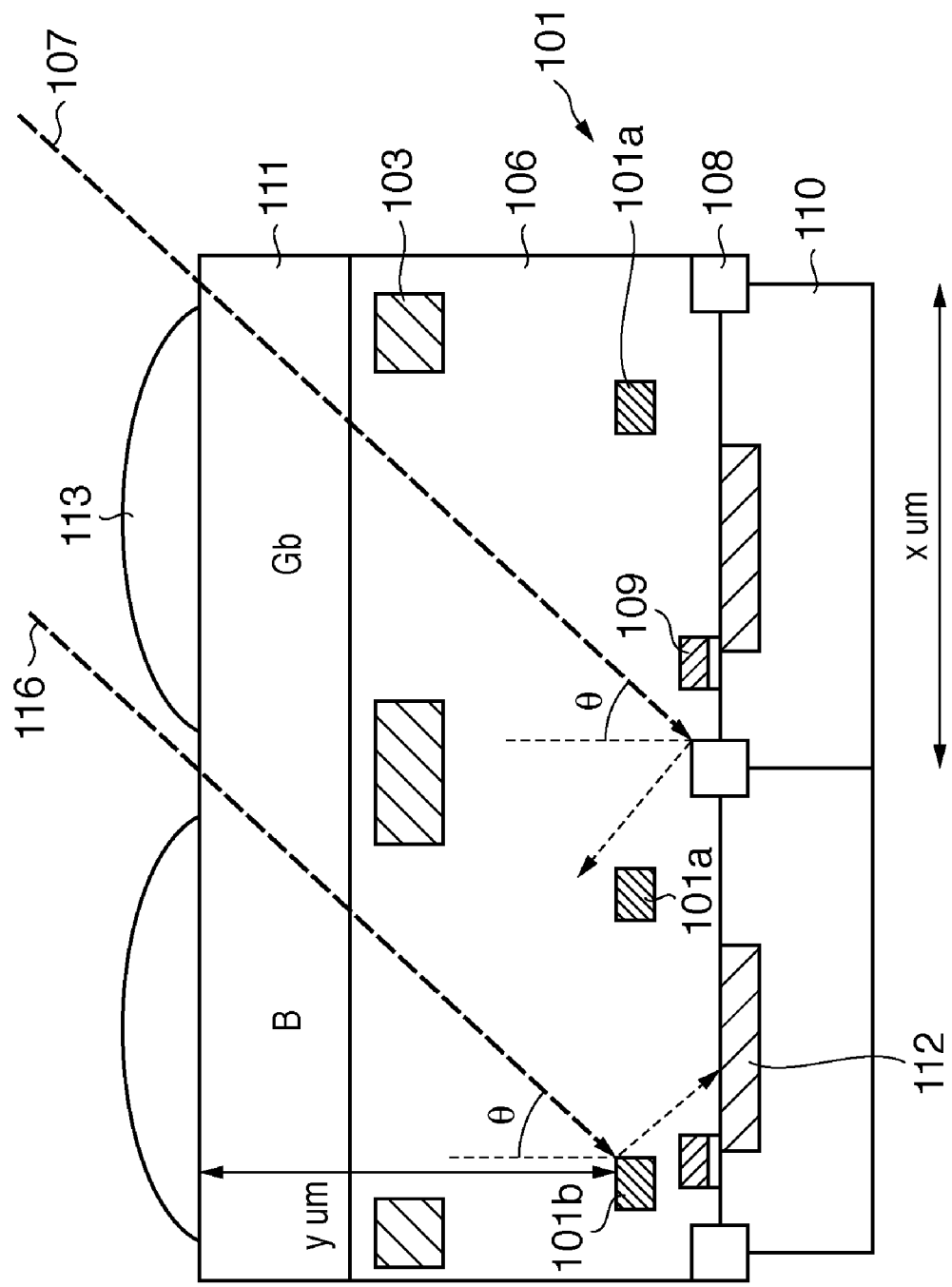
FIG. 8 is a sectional view showing the sectional structure of an image sensing apparatus according to the fifth embodiment of the present invention.

The fifth working example of the present invention will be explained with reference to FIG. 8. FIG. 8 is a sectional view showing the sectional structure of an image sensing apparatus according to the fifth working example of the present invention. FIG. 8 is a sectional view taken along a line c-c' in FIG. 7.

In the fifth working example, the aperture area of only a Gb pixel is increased without increasing that of a B pixel. Reference numeral 116 denotes a locus of a light beam which enters a pixel adjacent to one that receives a light beam 107. A wiring line 101b exists on only the B side among the Gb and B pixels. A light beam such as the light beam 107 leaks from the Gb pixel to the adjacent B pixel. To the contrary, a light beam as indicated by the locus 116 does not leak to an adjacent pixel. Even if light enters at an acute angle (large incident angle) θ, an image can be prevented from becoming reddish, reducing degradation of the image quality.

Sixth Working Example

Figure 9:
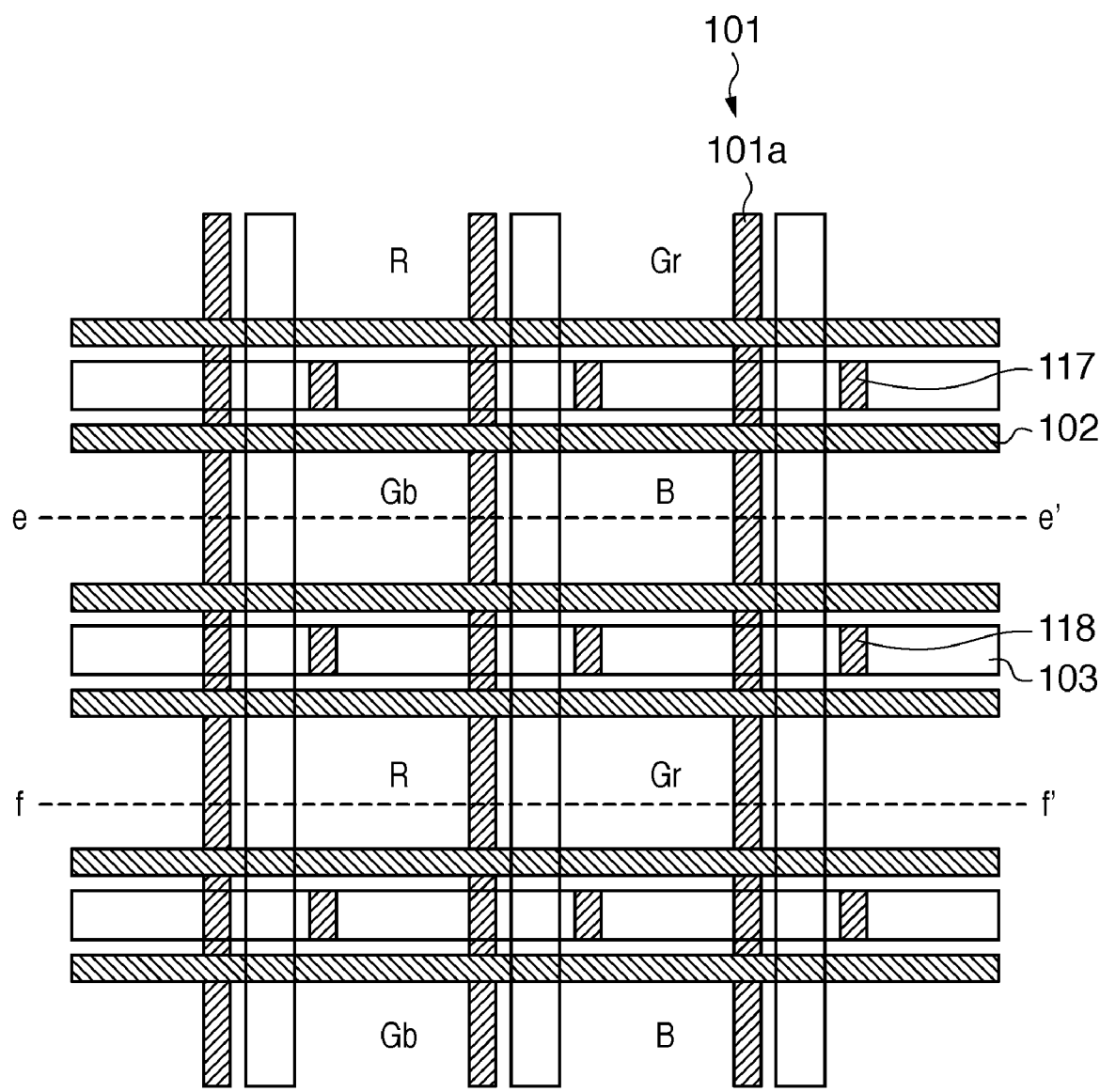
FIG. 9 is a plan view showing the layout of an image sensing apparatus under design according to the sixth embodiment of the present invention.
Figure 10:
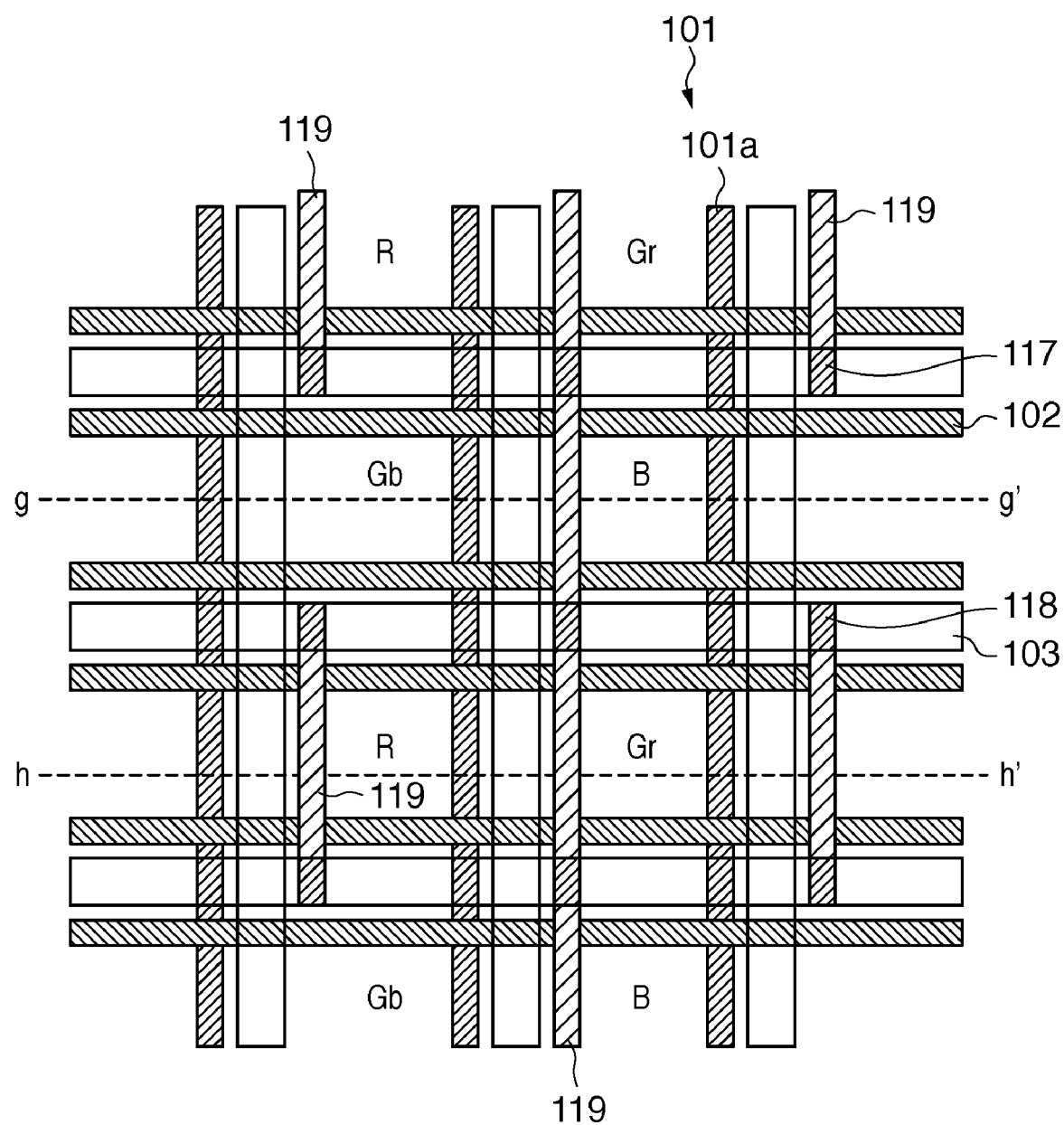
FIG. 10 is a plan view showing the layout of the image sensing apparatus according to the sixth embodiment of the present invention.

The sixth working example of the present invention will be explained with reference to FIGS. 9 and 10. FIG. 9 is a plan view showing the layout of an image sensing apparatus under design according to the sixth working example of the present invention. FIG. 10 is a plan view showing the layout of the image sensing apparatus according to the sixth working example of the present invention.

In the sixth working example, the influence of mixture of colors when light enters at an acute angle is reduced by arranging a dummy wiring line for a Gb pixel in a layout in which a pixel does not share a wiring line with an adjacent pixel. When each pixel includes one amplification transistor, all pixels have the same layout as shown in FIG. 9. For descriptive convenience, a wiring layer 103 is not hatched in FIG. 9. In FIG. 9, wiring lines 117 and 118 are used to connect a P- or N-type diffusion region to the wiring layer 103 in order to apply a given voltage to the diffusion region. When sharing the diffusion region between adjacent pixels, the wiring line 117 or 118 suffices to be formed on only one side.

After determining the layout as shown in FIG. 9, dummy wiring lines 119 are arranged in pixels except for Gb pixels as shown in FIG. 10. This causes great mixture of colors from the Gb pixel to the B pixel when light enters at a large incident angle which is an acute angle with respect to the surface. As a result, an image can be prevented from becoming reddish owing to fluctuation (poor white balance) of the influence of stray light on an image signal between colors, reducing degradation of the image quality.

While the present invention has been described with reference to exemplary embodiment or working examples, it is to be understood that the invention is not limited to the disclosed exemplary embodiment or working examples. The scope of the following claims is to be accorded the broadest interpretation so as to encompass all such modifications and equivalent structures and functions.

This application claims the benefit of Japanese Patent Application No. 2008-051120, filed Feb. 29, 2008, which is hereby incorporated by reference herein in its entirety.

What is claimed is:

1. An image sensing system comprising:
a pixel array in which a plurality of pixels including a first pixel and a second pixel are arrayed two-dimensionally;
a color filter array including a first color filter which selectively transmits light of a first wavelength so as to make light of the first wavelength enter the first pixel, and a second color filter which selectively transmits light of a second wavelength so as to make light of the second wavelength enter the second pixel;
a light shielding portion which is interposed between the color filter array and the pixel array, and defines an aperture for each of the plurality of pixels; and
a signal processing unit which amplifies signals from the first and second pixels,
wherein the amount of electric charges generated in the first pixel in accordance with light of the first wavelength entering the first pixel when white light having a continuous spectrum equivalent in light energy per unit wavelength width between all wavelengths in a visible region is partially transmitted by the first color filter is larger than the amount of electric charges generated in the second pixel in accordance with light of the second wavelength entering the second pixel when the light having the continuous spectrum is partially transmitted by the second color filter,
an area of the aperture of the light shielding portion, for the first pixel is larger than an area of the aperture of the light shielding portion, for the second pixel, and
the signal processing unit amplifies the signal from the first pixel with a gain that is smaller than a gain by which the signal processing unit amplifies the signal from the second pixel.

2. The system according to claim 1, wherein
the first wavelength is shorter than the second wavelength.

3. The system according to claim 1, wherein
the first pixel and the second pixel are arranged adjacent to each other.

4. The system according to claim 1, wherein
the light shielding portion includes a plurality of wiring layers, and
the aperture for each of the plurality of pixels is defined by a lowermost wiring layer of the light shielding portion.

5. The system according to claim 1, wherein the first color filter is a blue color filter and the second color filter is a red color filter.

6. An image sensing system comprising:
a pixel array in which a plurality of pixels including a first pixel and a second pixel are arrayed two-dimensionally;
a color filter array including a first color filter which selectively transmits light of a first wavelength so as to make light of the first wavelength enter the first pixel, and a second color filter which selectively transmits light of a second wavelength so as to make light of the second wavelength enter the second pixel;
a light shielding portion which is interposed between the color filter array and the pixel array, and defines an aperture region of each of the plurality of pixels, and
a signal processing unit which amplifies signals from the first and second pixels,
wherein the first wavelength is shorter than the second wavelength,
an area of the aperture of the light shielding portion, for the first pixel is larger than an area of the aperture of the light shielding portion, for the second pixel, and
the signal processing unit amplifies the signal from the first pixel with a gain that is smaller than a gain with which the signal processing unit amplifies the signal from the second pixel.

7. The system according to claim 6, wherein
the first pixel and the second pixel are arranged adjacent to each other.

8. The system according to claim 6, wherein
the light shielding portion includes a plurality of wiring layers, and
the aperture for each of the plurality of pixels is defined by a lowermost wiring layer of the light shielding portion.

9. The system according to claim 6, wherein the first color filter is a blue color filter and the second color filter is a red color filter.

10. An image sensing system comprising:
a pixel array in which a plurality of pixels including a first pixel and a second pixel are arrayed two-dimensionally;
a color filter array in which color filters are arrayed to form a Bayer array;
a light shielding portion which is interposed between the color filter array and the pixel array, and defines an aperture for each of the plurality of pixels; and
a signal processing unit which amplifies signals from the plurality of pixels,
wherein an area of an aperture of the light shielding portion for a blue pixel is larger than an area of an aperture of the light shielding portion for a red pixel, and
wherein the signal processing unit amplifies a signal from the blue pixel with a gain that is smaller than the gain with which the signal processing unit amplifies a signal from the red pixel.

* * * * *